United States Patent
Li et al.

(10) Patent No.: US 7,545,643 B2
(45) Date of Patent: Jun. 9, 2009

(54) HEAT DISSIPATION DEVICE WITH A FAN DUCT

(75) Inventors: Tao Li, Shenzhen (CN); Jun Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 187 days.

(21) Appl. No.: 11/681,735

(22) Filed: Mar. 2, 2007

(65) Prior Publication Data
US 2008/0170364 A1  Jul. 17, 2008

(30) Foreign Application Priority Data
Jan. 12, 2007  (CN) .................. 2007 1 0072945

(51) Int. Cl.
H05K 7/20 (2006.01)
F28F 7/00 (2006.01)
H05K 5/00 (2006.01)

(52) U.S. Cl. .................. 361/697; 165/80.3; 454/184; 257/718

(58) Field of Classification Search ......... 361/694–695, 361/697; 174/16.1, 16.3; 257/718, 722; 165/80.3, 185; 29/890.03; 454/184
See application file for complete search history.

(56) References Cited

U.S. PATENT DOCUMENTS

| | | | |
|---|---|---|---|
| 6,199,624 B1 * | 3/2001 | Wotring | 165/80.3 |
| 6,215,659 B1 | 4/2001 | Chen | |
| 7,040,384 B2 | 5/2006 | Shiang-Chich | |
| 7,178,583 B2 * | 2/2007 | Huang | 165/121 |
| 2005/0270740 A1 * | 12/2005 | Tai et al. | 361/690 |
| 2007/0058342 A1 * | 3/2007 | Wu et al. | 361/695 |

* cited by examiner

*Primary Examiner*—Jayprakash N Gandhi
*Assistant Examiner*—Zachary M Pape
(74) *Attorney, Agent, or Firm*—Frank R. Niranjan

(57) ABSTRACT

A heat dissipation device adapted for cooling a heat-generating electronic component includes a heat sink (30), a fan (40) mounted on the heat sink (30), a fan duct (70) mounted on the fan (40) and a clip (50) securing the fan duct (70) on the fan (40). The fan (40) is sandwiched between a top of the heat sink (30) and a bottom of the fan duct (70). The clip (70) includes an axis (51) pivotably mounted on to a bottom of the fan duct (70), a locking portion (52) extending from an end of the axis (51) and buckled with the fan duct (70), and a pressing portion (53) bent from the axis (51) and engaging with a bottom surface of the top plate (42) of the fan (40).

12 Claims, 7 Drawing Sheets

HEAT DISSIPATION DEVICE WITH A FAN DUCT

BACKGROUND OF THE INVENTION

1. Field of the Invention

The present invention relates to a heat dissipation device, and more particularly to a heat dissipation device having a fan duct to guide the air flowing through a heat sink for cooling an electronic component, such as an integrated circuit package.

2. Description of Related Art

Electronic components, such as central processing units (CPUs) generate large amounts of heat during normal operation, which can destabilize the CPUs and cause damage to the CPUs. Oftentimes, a heat dissipation device is used to dissipate heat from a CPU. The heat dissipation device frequently comprises a fan for facilitating removal of heat from the electronic device.

Conventionally, a heat sink is mounted on the CPU inside a computer. The fan is directly mounted on the heat sink. The fan generates a current of air flowing through the heat sink, to enhance heat dissipation into the surrounding air.

To facilitate outside cool air to be drawn by the fan through the heat sink, a fan duct has been developed to guide air flowing into the computer and toward the heat sink. A conventional heat dissipation device with a fan duct is disclosed in U.S. Pat. No. 7,040,384 B2. The heat dissipation device comprises a fan mounted to a heat sink secured on a CPU, and a fan duct. The fan duct is fixed to the fan by screws. It is necessary to use a screwdriver or other tool to manipulate the screws. Therefore it is inconvenient for the fan duct to be assembled or disassembled. Another conventional heat dissipation device is disclosed in U.S. Pat. No. 6,215,659 B1. The fan duct assembly comprises a fan duct attached to a computer enclosure for receiving a fan. The fan duct comprises two sidewalls. Each sidewall has a fixing edge adapted for abutting against the computer enclosure. The fan duct is locked to a panel of the computer enclosure via the fixing edges thereof. It is laborious to disassemble the fan duct from the panel of the computer enclosure.

Thus, it is desired to devise a fan duct which can easily be assembled within and disassembled from a fan.

SUMMARY OF THE INVENTION

According to a preferred embodiment of the present invention, a heat dissipation device adapted for cooling a heat-generating electronic component includes a heat sink, a fan mounted on the heat sink, a fan duct mounted on the fan and a clip securing the fan duct on the fan. The fan is sandwiched between a top of the heat sink and a bottom of the fan duct. The clip includes an axis pivotably mounted on to a bottom of the fan duct, a locking portion extending from an end of the axis and buckled with the fan duct, and a pressing portion bent from the axis and engaging with the top plate of the fan. The heat dissipation device can firmly and conveniently mount the fan duct to the fan.

Other advantages and novel features of the present invention will become more apparent from the following detailed description of preferred embodiment when taken in conjunction with the accompanying drawings.

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
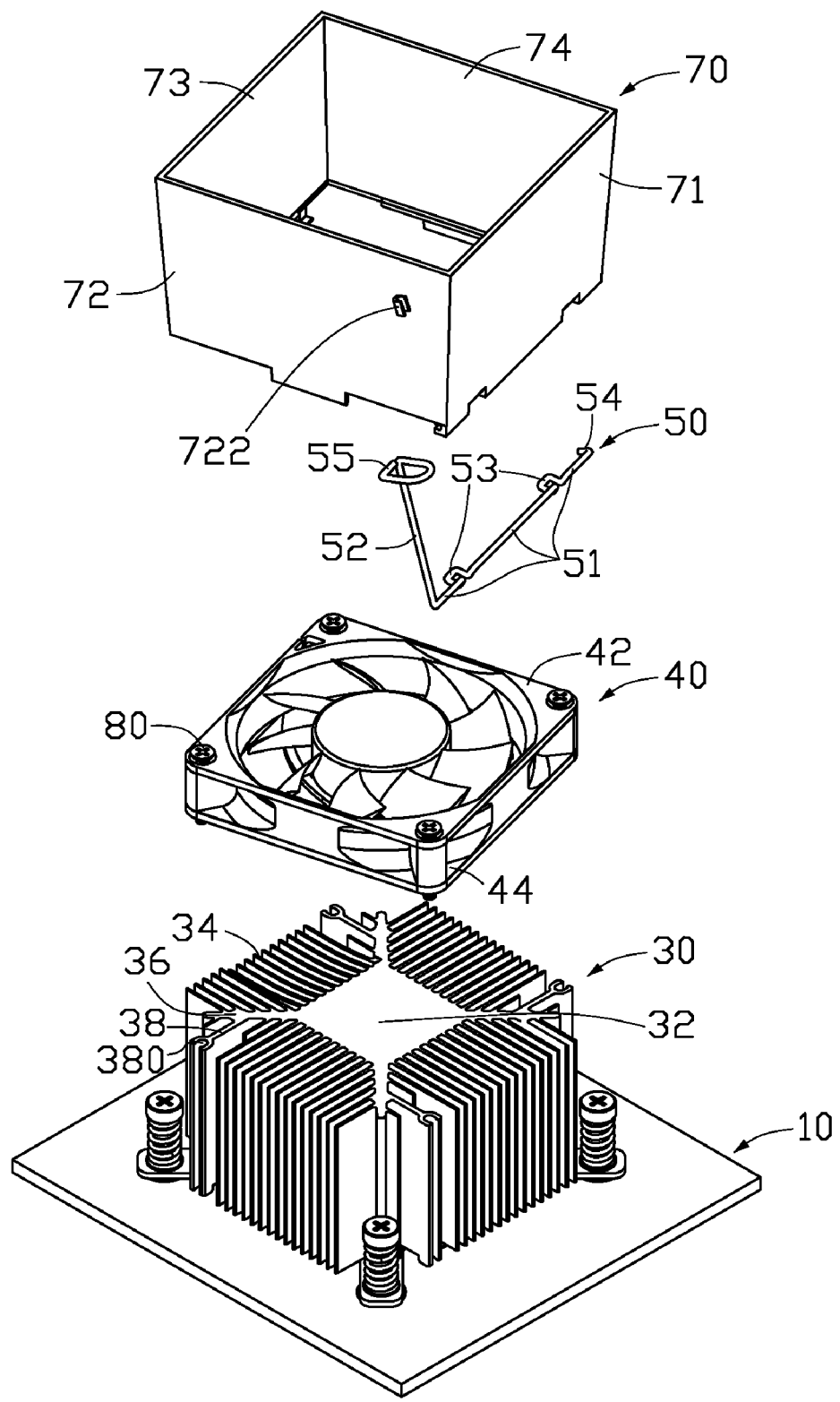
FIG. 1 is an exploded view of a heat dissipation device in accordance with a preferred embodiment of the present invention.

Referring to FIG. 1, a heat dissipation device of the preferred embodiment of the present invention is used for mounting to a printed circuit board 10 to remove heat from a heat-generating electronic device (not shown) mounted on the printed circuit board 10, such as a CPU (not shown). The heat dissipation device comprises a heat sink 30 mounted on the printed circuit board 10, a fan 40 mounted on the heat sink 30, a fan duct 70 and a clip 50 securing the fan duct 70 on the fan 40.

The heat sink 30 comprises a solid core 32 shaped similar to a rectangular solid and four symmetrical branches 36 extending outwardly from four edges of the core 32. A plurality of fins 34 projects outwardly from sides of the core 32 and the branches 36. The fins 34 are divided into four groups (not labeled) each oriented towards a different direction. The fins 34 of each group are parallel to each other. Two neighboring groups of the fins 34 are oriented perpendicularly to each other. Four locking plates 38 extend from the branches 36 near free ends of the branches 36 and are parallel to the fins 34 of the respective groups. Each of the locking plates 38 is bifurcated at a free end thereof to define an insertion hole 380.

The fan 40 comprises a frame having a rectangular configuration. The frame comprises a top plate 42 and a bottom plate 44 opposite and parallel to the top plate 42. Four screws 80 extend through corners (not labeled) of the top plate 42 and the bottom plate 44 of the fan 40, and are threadedly engaged in the insertion holes 380 of the locking plates 38 thus mounting the fan 40 onto the heat sink 30.

The clip 50 can be integrally made from a unitary metal wire. The clip 50 comprises a linear axis 51 pivotably mounted on a bottom of the fan duct 70 and a locking portion 52 extending from one free end of the axis 51. A pair of pressing portions 53 are bent from the axis 51 and devised for engaging with the top plate 42 of the fan 40. Opposite to the locking portion 52, at the distant end of the axis 52, the clip 50 is bent to form a retaining-pin 54. The free end of the locking portion 52 opposite to the axis 51 is bent to form a handle 55 for facilitating operation.

Figure 2:
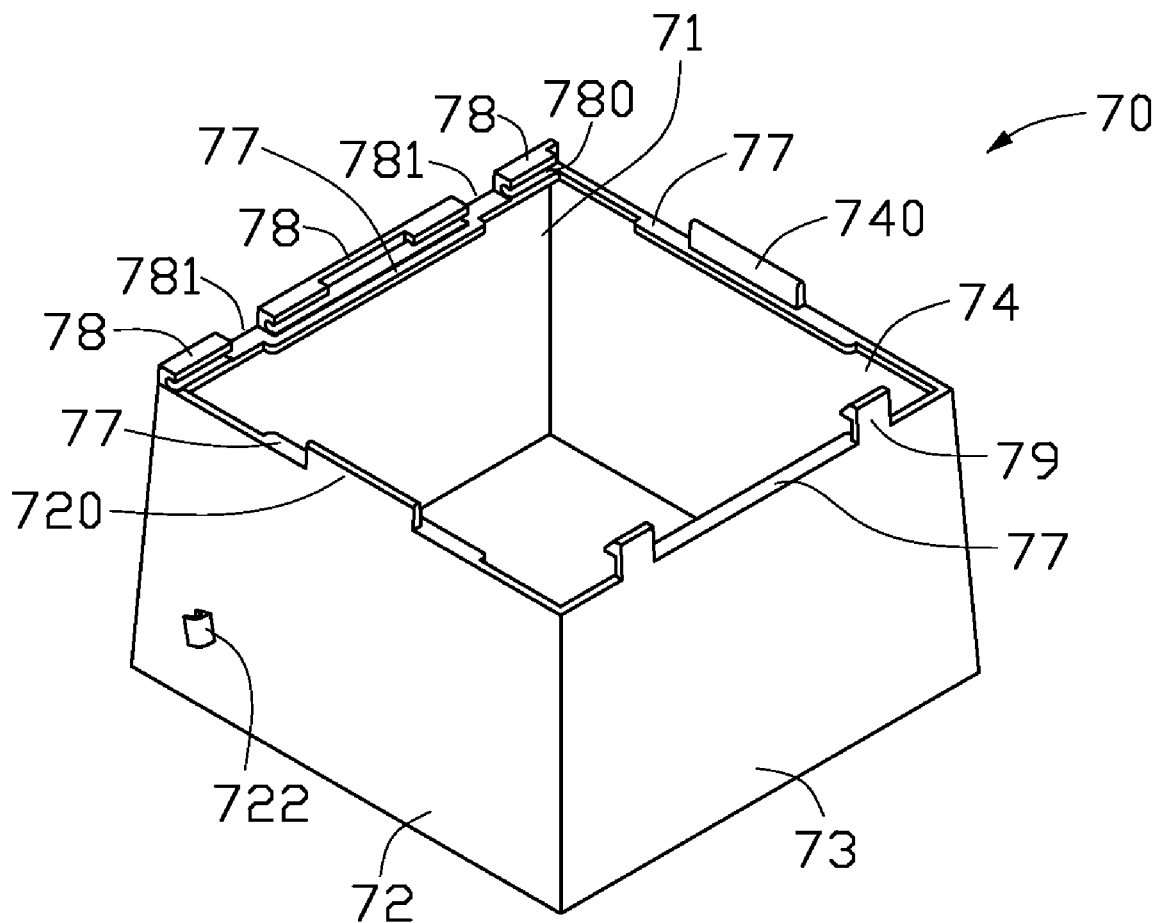
FIG. 2 is an inverted view of a fan duct of the heat dissipation device of FIG. 1.
Figure 5:
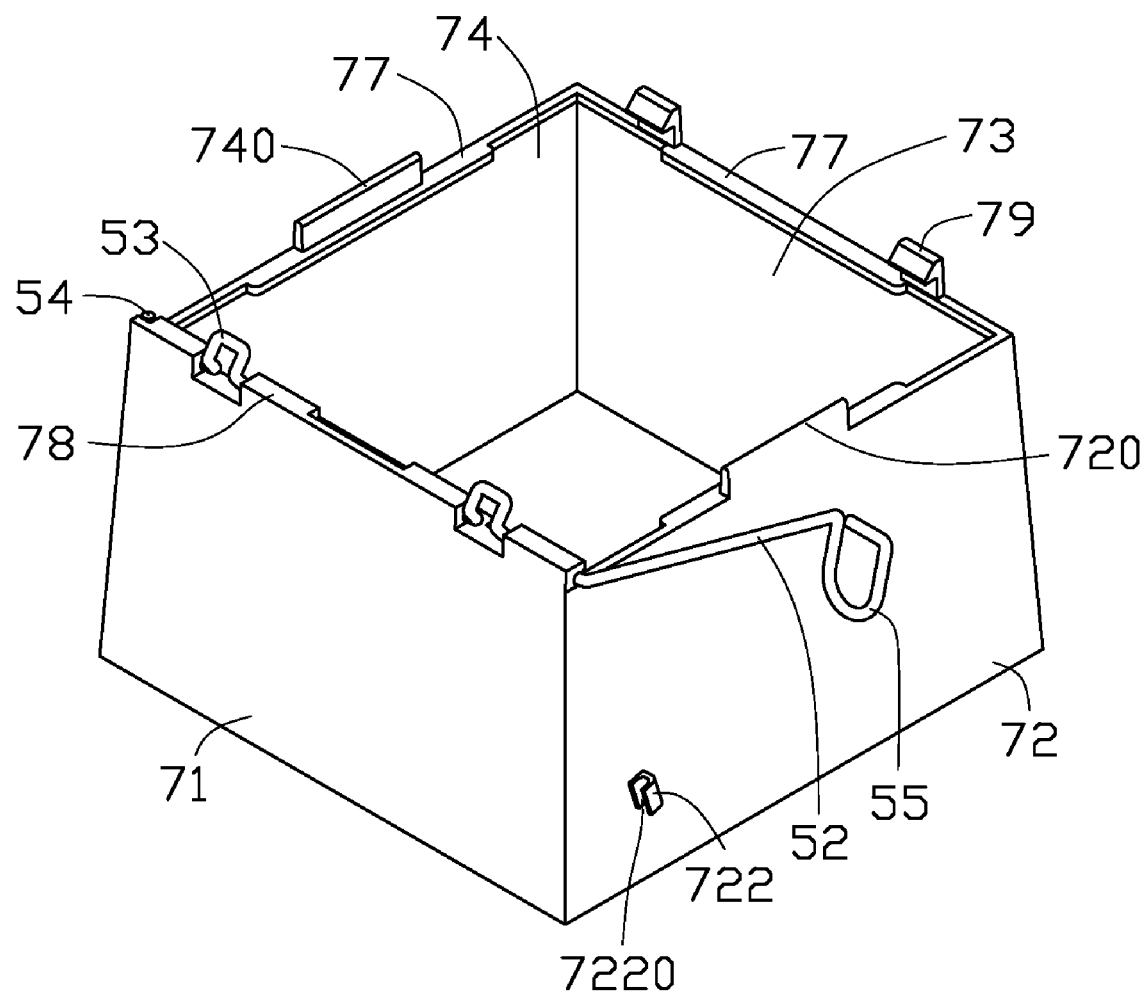
FIG. 5 is another aspect view of FIG. 3.
Figure 6:
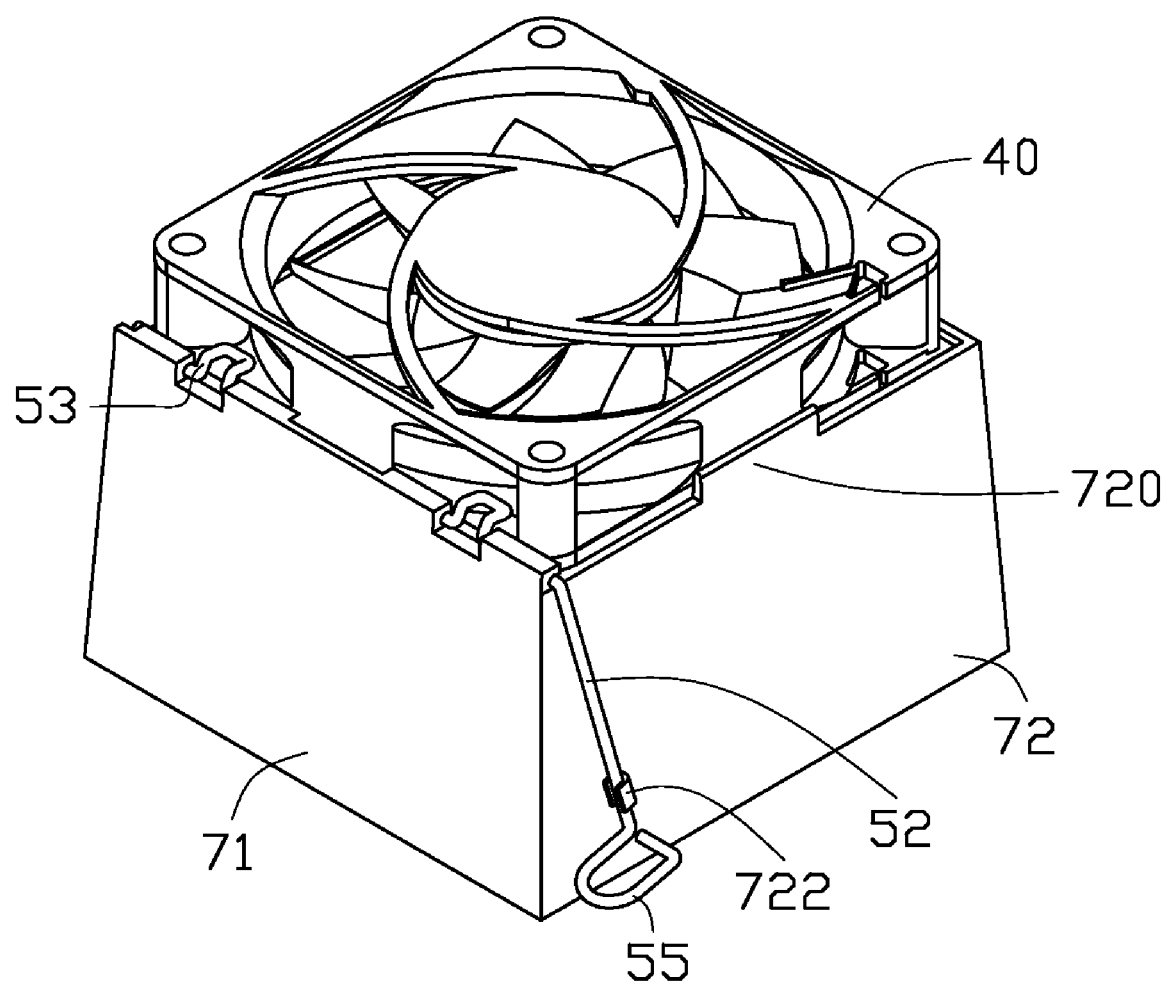
FIG. 6 is an inverted, assembled view of the fan, the fan duct and the clip of the heat dissipation device of FIG. 1.
Figure 7:
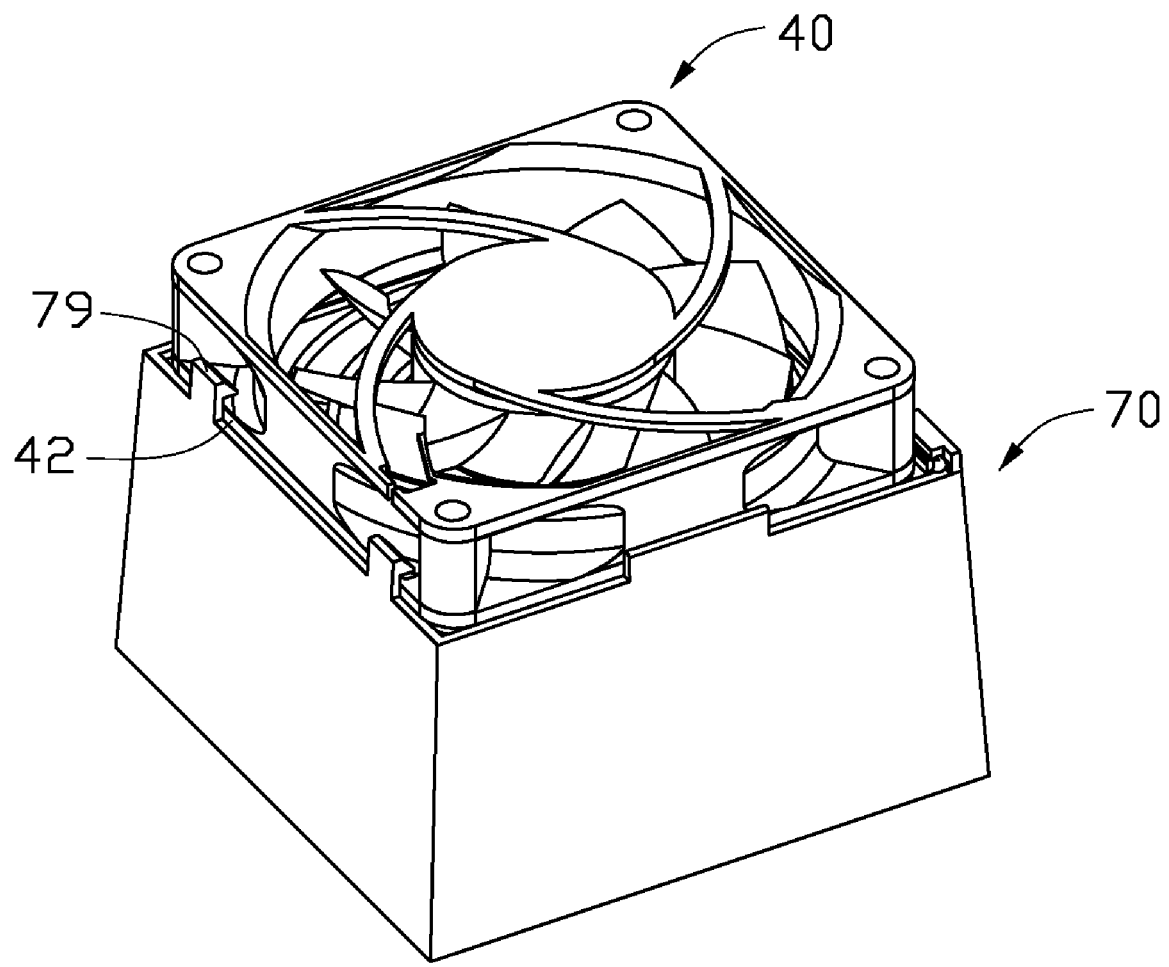
FIG. 7 is another aspect view of FIG. 6.

Referring to FIG. 2, the fan duct 70 comprises a first wall 71, a second wall 72, a third wall 73 opposite to the first wall 71, and a fourth wall 74 opposite to the second wall 72. The four walls 71, 72, 73, 74 have an end-to-end connection and form a funneled configuration with an upper opening (not labeled) and a lower opening (not labeled) opposite to the upper opening. The lower opening is smaller than the upper opening. The lower opening is oriented to the top plate 42 of the fan 40. A flange 77 extends horizontally and inwardly from the bottom of each of the walls 71, 72, 73 and 74 for engaging with the top plate 42 of the fan 40. A retaining block 78 is formed at a bottom of the flange 77 of the wall 71. A retaining slot 780 is defined at an inner side of the retaining block 78. The axis 51 of the clip 50 is pivotably received in the retaining slot 780 of the retaining block 78. A pair of cutouts 781 are defined across the retaining block 78 for receiving the pressing portions 53 of the clip 50, wherein the cutouts 781 divide the retaining block 78 into three portions. Two lateral flanges 720, 740 extend downwardly from the bottoms of the second wall 72 and the fourth wall 74 respectively located at two opposite sides of the fan 40; thus, a horizontal movement of the fan duct 70 relative to the fan 40 is restricted. A pair of latches 79 extend downwardly from the bottom of the third wall 73 to engage with the top plate 42 of the fan 40. A locking block 722 is formed on the outer surface of the second wall 72. The locking block 722 defines a groove 7220 (shown in FIG. 5) therein for snapping the locking portion 52 of the clip 50.

Figure 3:
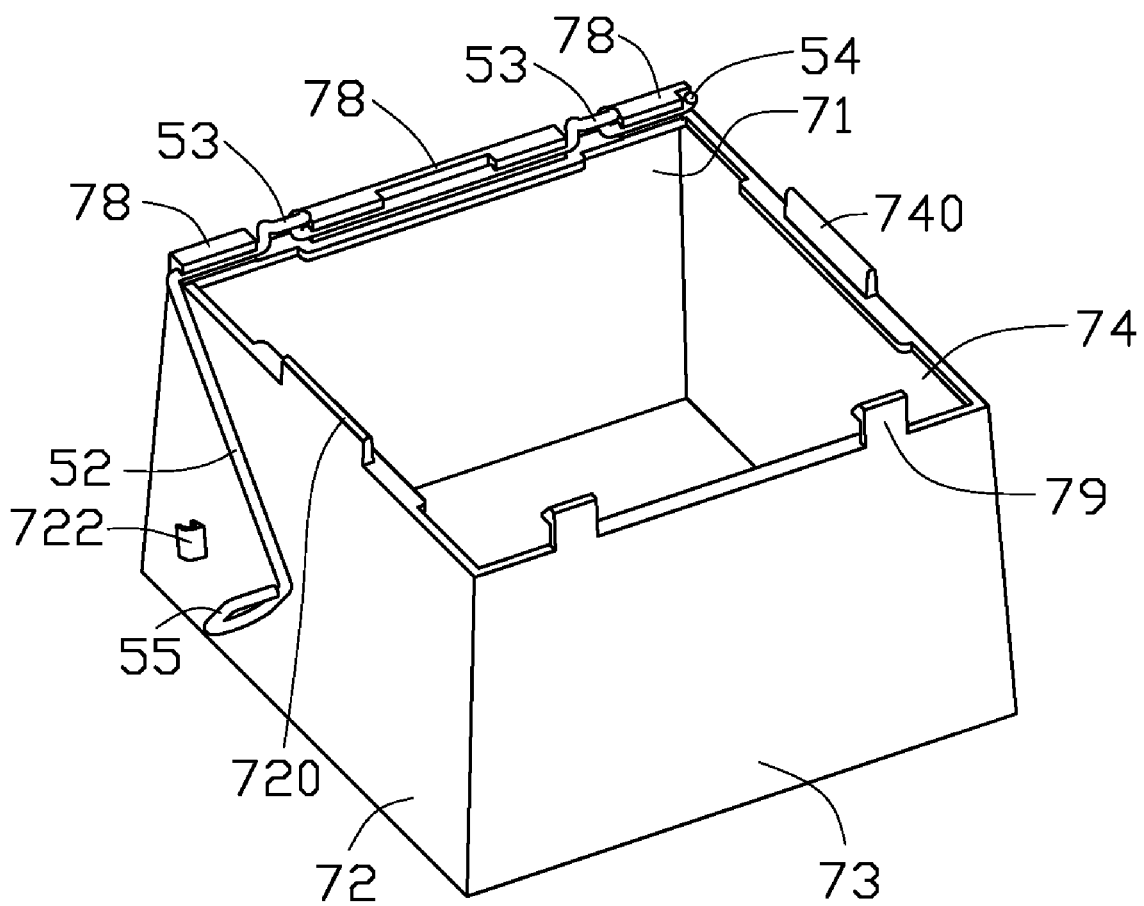
FIG. 3 is an inverted, partly assembled view of the fan duct and a clip of the heat dissipation device of FIG. 1.
Figure 4:
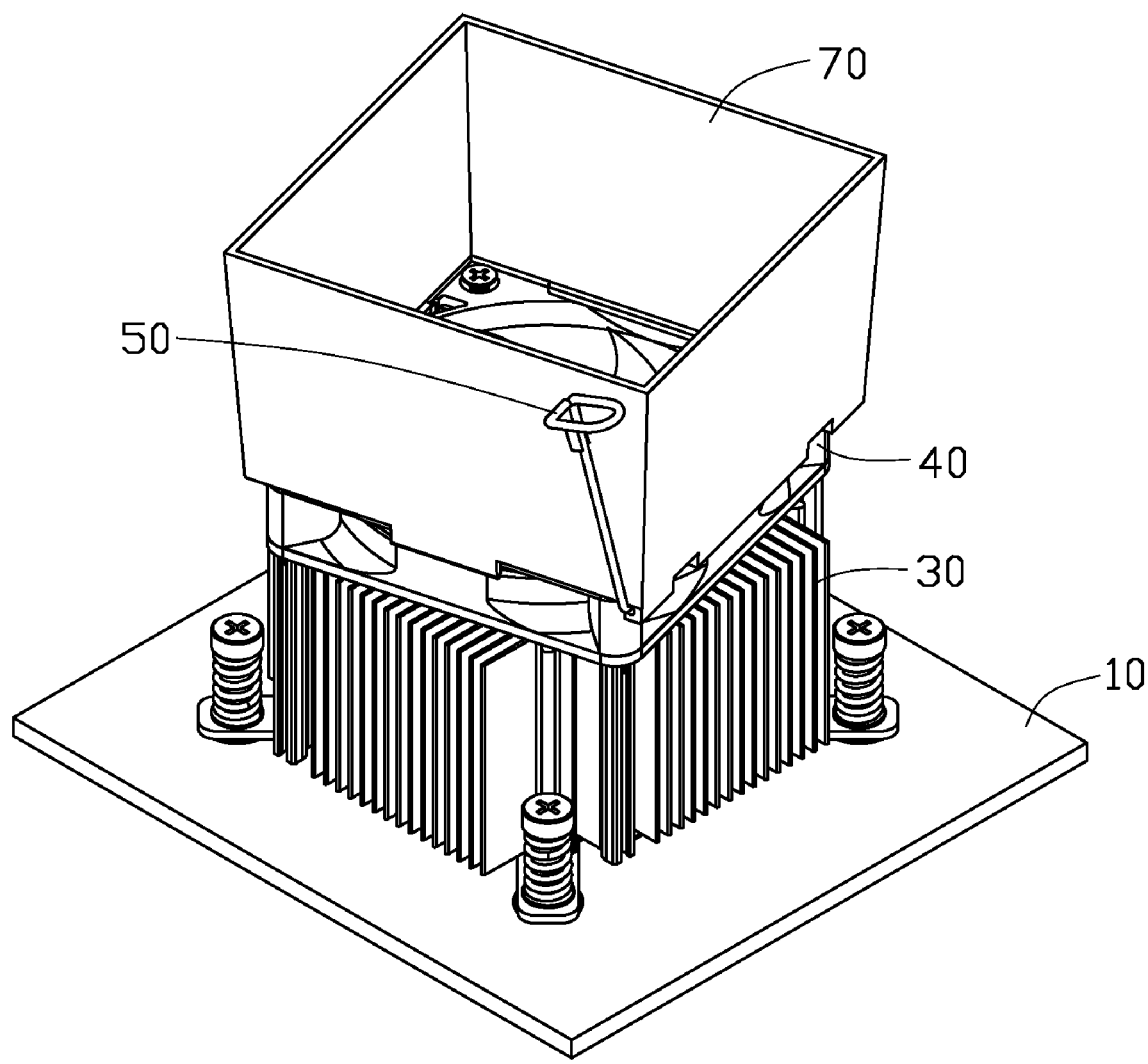
FIG. 4 is an assembled view of FIG. 1.

Referring to FIG. 3, in assembly, the clip 50 is pivotably mounted on the bottom of the fan duct 70 with the axis 51 of the clip 50 received in the retaining slot 780 of the retaining block 78 of the first wall 71. Referring to FIGS. 4-7, an arrangement of the fan duct 70, the clip 50, and the fan 40 is shown. The flanges 77 of the walls 71, 72, 73, 74 engage with the top plate 42 of the fan 40. The retaining block 78 of the first wall 71, the lateral flanges 720, 740 of the second and fourth walls 72, 74, and the latches 79 of the third wall 73 are respectively located at four sides of the fan 40; thus, a horizontal movement of the fan duct 70 relative to the fan 40 is restricted. In an original position, the clip 50 is disengaged from the locking block 722. The locking portion 52 of the clip 50 is far away from the locking block 722 and the retaining pin 54 of the clip 50 abuts against a free end of the retaining block 78. The handle 55 of the clip 50 is then driven to rotate about the axis 51 slantwise and upwardly; simultaneously, the pressing portions 53 of the clip 50 are rotated in the retaining slot 780 of the retaining block 78 to reach a horizontal position to press a bottom surface of the top plate 42 of the fan 40. In this position, the locking portion 52 of the clip 50 is snappingly engaged in the groove 7220 of the locking block 722. Thus, the fan duct 70 is firmly secured to the fan 40.

The fan duct 70 is conveniently detached from the fan 40 by rotating the handle 55 of the clip 50 to drive the locking portion 52 of the clip 50 to be lowered and disengaged from the locking block 722. The fan duct 70 can easily be removed from the fan 40.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat sink for contacting with a heat-generating electronic component;
   a fan mounted on the heat sink and having a top plate;
   a fan duct mounted on the fan, and the fan sandwiched between a top of the heat sink and a bottom of the fan duct; and
   a clip comprising an axis pivotably mounted on a bottom of the fan duct, a locking portion extending from an end of the axis and buckled with the fan duct, and a pressing portion bent from the axis and engaging with the top plate of the fan.

2. The heat dissipation device of claim 1, wherein the fan duct comprises walls extending upwardly relative to the top plate of the fan to define two opposite openings.

3. The heat dissipation device of claim 2, wherein the two opposite openings comprise an upper opening and a lower opening smaller than the upper opening of the fan duct, and the lower opening faces to the top plate of the fan.

4. The heat dissipation device of claim 2, wherein a bottom of each of the walls extends horizontally a flange for contacting with an upper surface of the top plate of the fan.

5. The heat dissipation device of claim 2, the walls comprises a first wall, a second wall, a third wall opposite to the first wall, and a fourth wall opposite to the second wall, and these walls have an end-to-end connection.

6. The heat dissipation device of claim 5, wherein a retaining block extends downwardly from a bottom of the first wall of the fan duct and the axis of the clip is pivotably received in the retaining block.

7. The heat dissipation device of claim 5, wherein a pair of latches extend downwardly from a bottom of the third wall and engage with the top plate of the fan.

8. The heat dissipation device of claim 5, wherein two lateral flanges extend respectively from bottoms of the second and fourth walls for restricting a horizontal movement of the fan duct relative to the fan.

9. The heat dissipation device of claim 2, wherein a locking block is formed on an outer surface of the walls for retaining the locking portion of the clip.

10. The heat dissipation device of claim 1, wherein a handle is bent from the locking portion of the clip for facilitating operation.

11. The heat dissipation device of claim 1, wherein the heat sink comprises a solid core and four symmetrical branches extending outwardly from four edges of the core, and four locking plates extend from the branches near free ends of the branches.

12. The heat dissipation device of claim 1, wherein the pressing portion bent from the axis of the clip engages with a bottom surface of the top plate of the fan.

* * * * *